United States Patent
Ikenaga et al.

(10) Patent No.: US 9,590,677 B2
(45) Date of Patent: Mar. 7, 2017

(54) VARIABLE CAPACITANCE DEVICE AND ANTENNA APPARATUS

(71) Applicant: TAIYO YUDEN CO., LTD., Tokyo (JP)

(72) Inventors: Tomokazu Ikenaga, Tokyo (JP); Daiki Ishii, Tokyo (JP); Kentaro Morito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/941,359

(22) Filed: Nov. 13, 2015

(65) Prior Publication Data

US 2016/0142105 A1    May 19, 2016

(30) Foreign Application Priority Data

Nov. 19, 2014 (JP) ................. 2014-234298

(51) Int. Cl.
| | |
|---|---|
| H04B 1/18 | (2006.01) |
| H03H 5/12 | (2006.01) |
| H04B 5/00 | (2006.01) |
| H03H 7/40 | (2006.01) |

(52) U.S. Cl.
CPC .............. H04B 1/18 (2013.01); H03H 5/12 (2013.01); *H03H 7/40* (2013.01); *H04B 5/0075* (2013.01)

(58) Field of Classification Search
USPC ............................ 455/193.1–193.3, 121–125
See application file for complete search history.

(56) References Cited

U.S. PATENT DOCUMENTS

| | | | | |
|---|---|---|---|---|
| 3,569,795 A | * | 3/1971 | Gikow | H01G 7/06 361/321.1 |
| 9,147,527 B2 | * | 9/2015 | Ikenaga | H01L 28/55 |
| 2004/0164819 A1 | * | 8/2004 | Mishima | H01G 4/33 333/174 |
| 2010/0056098 A1 | | 3/2010 | Kanno et al. | |
| 2011/0134582 A1 | | 6/2011 | Kanno | |

(Continued)

FOREIGN PATENT DOCUMENTS

| | | |
|---|---|---|
| JP | 2005-64437 A | 3/2005 |
| JP | 2008-66682 A | 3/2008 |

(Continued)

*Primary Examiner* — Edward Urban
*Assistant Examiner* — Rui Hu
(74) *Attorney, Agent, or Firm* — Chen Yoshimura LLP (57) ABSTRACT

A variable capacitance device includes: a first and second terminal for signals; a plural, even number of variable capacitance elements connected in-series between the first and second terminal; a third and fourth terminal for receiving a same voltage; a fifth and sixth terminal for grounding; a plurality of first resistors connected to either the third or fourth terminal on one end; and a plurality of second resistors connected to either the fifth or sixth terminal on one end. With respect to a series of successive nodes beginning with the first terminal and ending with the second terminal, respective other ends of a pair of the first resistors are connected to every other node, and respective other ends of a pair of the second resistors are connected to the remaining every other node, such that the pairs of first and second resistors are alternately connected to the series of successive nodes.

5 Claims, 13 Drawing Sheets

(56) References Cited

U.S. PATENT DOCUMENTS

| | | | | |
|---|---|---|---|---|
| 2014/0139968 A1* | 5/2014 | Ikenaga | .................. | H01L 28/55 |
| | | | | 361/281 |
| 2014/0227978 A1* | 8/2014 | Ikeda | ...................... | H01Q 7/00 |
| | | | | 455/41.2 |
| 2015/0133064 A1* | 5/2015 | Horne | ..................... | H03H 7/40 |
| | | | | 455/77 |
| 2015/0294795 A1* | 10/2015 | Ueki | ....................... | H01G 4/40 |
| | | | | 361/56 |
| 2016/0133387 A1* | 5/2016 | Kanno | .................... | H01G 7/06 |
| | | | | 307/109 |

FOREIGN PATENT DOCUMENTS

| | | |
|---|---|---|
| JP | 2010-55570 A | 3/2010 |
| JP | 2011-119482 A | 6/2011 |

* cited by examiner

| Forward Connection | C101 | C102 | C103 | C104 | Total | Variability |
|---|---|---|---|---|---|---|
| When 0 V is applied | 400 | 400 | 400 | 400 | 100 | 33% |
| When 3 V is applied | 268 | 268 | 268 | 268 | 67 | |

| Reverse Connection | C101 | C102 | C103 | C104 | Total | Variability |
|---|---|---|---|---|---|---|
| When 0 V is applied | 400 | 400 | 400 | 400 | 100 | 20% |
| When 3 V is applied | 400 | 268 | 268 | 400 | 80 | |

Prior Art

|  | C1 | C2 | C3 | C4 | Total | Variability |
|---|---|---|---|---|---|---|
| When 0 V is applied | 200 | 200 | 200 | 200 | 50 | 33% |
| When 3 V is applied | 134 | 134 | 134 | 134 | 33.5 | |

VARIABLE CAPACITANCE DEVICE AND ANTENNA APPARATUS

BACKGROUND OF THE INVENTION

Technical Field

The present invention relates to a variable capacitance device and an antenna apparatus that uses the variable capacitance device.

Background Art

In mobile FeliCa near field communication (NFC) modules, there is a phenomenon that occurs in which variance in the coils of an antenna causes the resonant frequency of 13.56 MHz to shift, thereby deteriorating the receiving sensitivity of the modules, for example. Thus, a frequency-adjusting circuit that includes capacitors is incorporated into the modules, all devices are checked during shipment, and the capacitances of the capacitors are finely adjusted to correct the shift in the resonant frequency.

Conventionally, switched capacitors, in which field effect transistor (FET) switches are connected in series in a fixed capacitance element, have been used. A setting to switch the FETs is written in advance into a control integrated circuit (IC) when being checked for shipment to switch the FETs when the NFC is in use, thus finely adjusting the capacitances of the capacitors.

On the other hand, recently, there has been research in switching to general-purpose ceramic capacitors that have excellent breakdown voltage and are cheaper compared to the FET switches. Ceramic capacitor materials have a characteristic in which the capacitance decreases as DC bias voltage is applied, and it is this characteristic that is being proactively utilized.

There has also been research in adopting a variable capacitance device that uses a plurality of variable capacitance elements that include a dielectric layer formed using thin films as opposed to a sintered body, because ceramic capacitors have problems such as capacitance changing over time.

However, when a conventional variable capacitance device is inserted into an apparatus in the wrong direction, there is a possibility that sufficient capacitance variability cannot be obtained even when voltage is applied, because the variable capacitance device has directionality due to its structure.

Figure 1A:
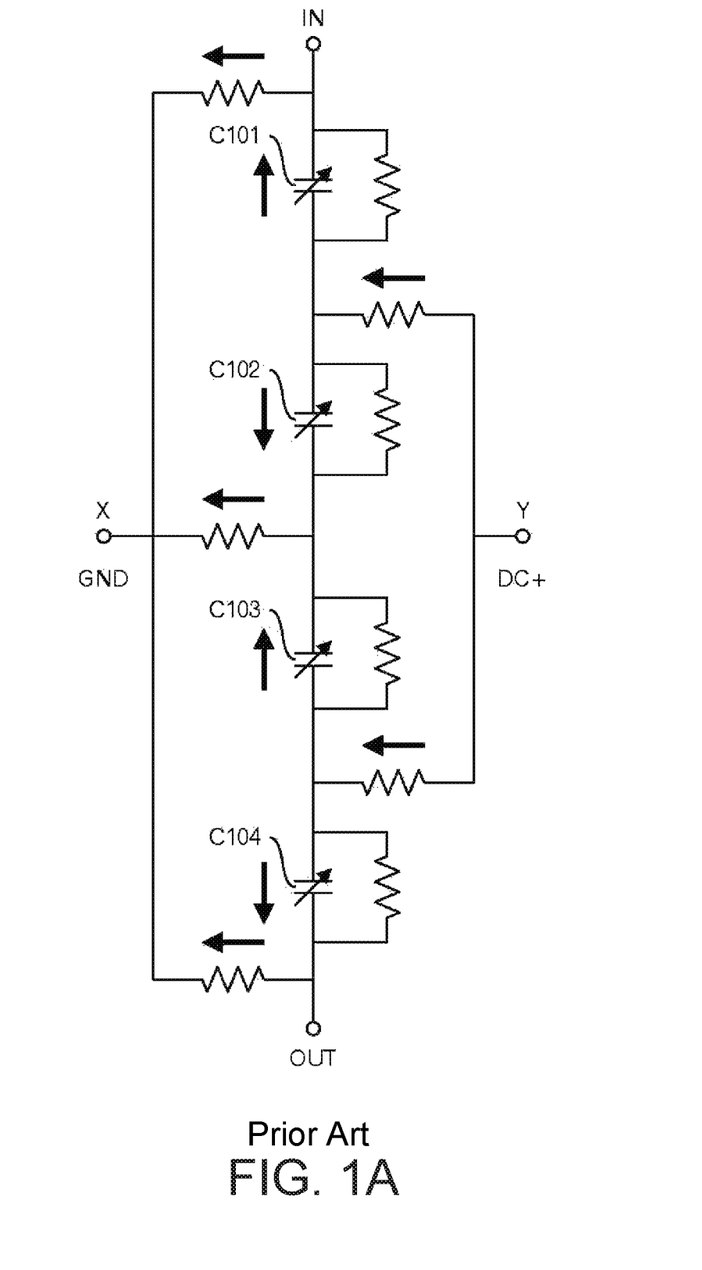
FIG. 1A shows a correct connection.
Figure 1B:
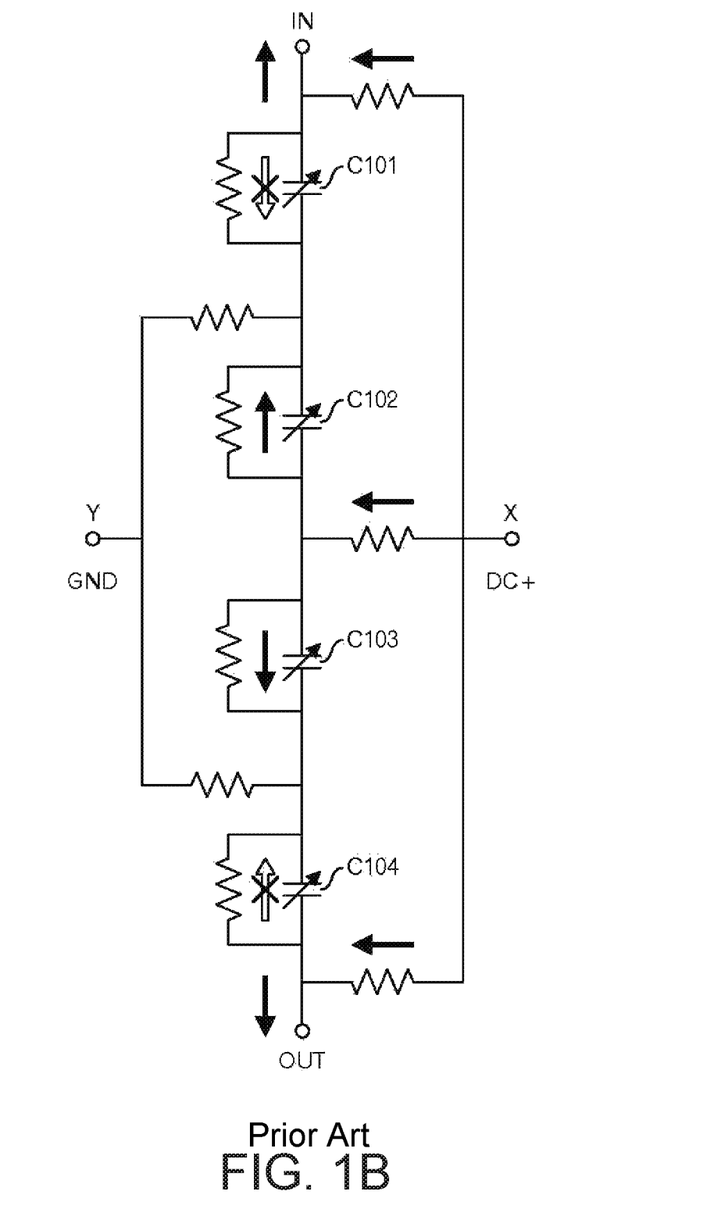
FIG. 1B shows an incorrect connection.

FIGS. 1A and 1A show an example configuration of a conventional variable capacitance device, for example. In this conventional variable capacitance device, variable capacitance elements C101-C104 are connected in series between an input terminal IN and an output terminal OUT, and bias applying terminals X, Y are provided to the right and to the left of the variable capacitance elements C101-C104. As shown in FIG. 1A, a correct connection (also referred to as a forward connection) for this conventional variable capacitance device is one in which the terminal X, which is connected to the variable capacitance elements C101-C104 through three resistors, is connected to ground GND, and a prescribed voltage DC+ is applied to the terminal Y, which is connected to the variable capacitance elements C101-C104 through two resistors. The current flows from the terminal Y towards the terminal X in the directions shown by the arrows.

On the other hand, as shown in FIG. 1B, an incorrect connection (also referred to as a reverse connection) is one in which the terminal Y is connected to ground GND and a prescribed voltage DC+ is applied to the terminal X. In this case, the current flows from the terminal X towards the terminal Y in the directions shown by the arrows. The current does not flow to the variable capacitance elements C101, C104, and the applied voltage does not change.

Figure 2:
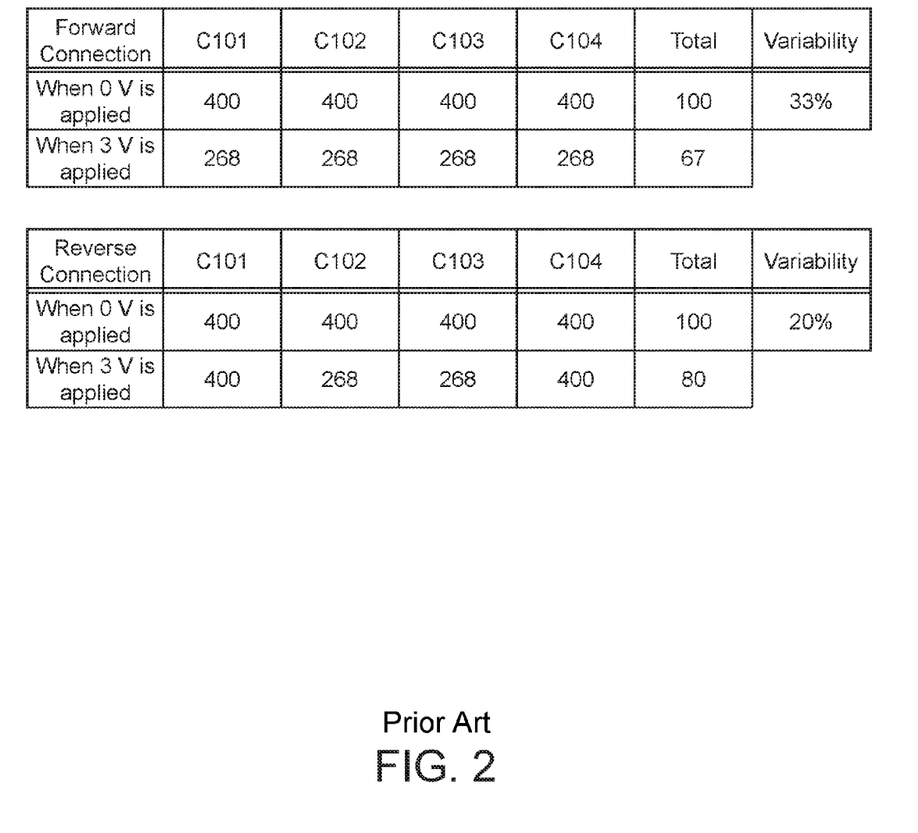
FIG. 2 is a table for describing the conventional variable capacitance device.

As shown in FIG. 2, in the case of the forward connection, when DC+=0 V, the capacitance of each of the variable capacitance elements C101-C104 is 400 pF, and when DC+=+3 V, the capacitance of each of the variable capacitance elements C101-C104 decreases 33%, becoming 268 pF, for example. Thus, when DC+=0 V, the capacitance as a whole is 100 pF, and when DC+=+3 V, the capacitance becomes 67 pF, thereby changing the capacitance as a whole by 33%.

On the other hand, in the case of the reverse connection, when DC+=+3 V, the capacitances of the variable capacitance elements C102, C103 decrease by 33% to become 268 pF, but the capacitances of the variable capacitance elements C101, C104 do not change. Accordingly, when DC+=0 V, the capacitance as a whole is 100 pF, and even when DC+=+3 V, the capacitance becomes 80 pF, thereby changing the capacitance as a whole by only 20%.

Thus, it is not possible to sufficiently adjust the capacitances of the capacitors, creating a situation in which deviations in resonant frequency cannot be sufficiently corrected.

RELATED ART DOCUMENTS

Patent Documents

Patent Document 1: Japanese Patent Application Laid-Open Publication No. 2010-55570
Patent Document 2: Japanese Patent Application Laid-Open Publication No. 2011-119482
Patent Document 3: Japanese Patent Application Laid-Open Publication No. 2008-66682
Patent Document 4: Japanese Patent Application Laid-Open Publication No. 2005-64437

SUMMARY OF THE INVENTION

Accordingly, the present invention is directed to a scheme that substantially obviates one or more of the above-discussed and other problems due to limitations and disadvantages of the related art. Thus, according to one aspect of the present invention, an objective is to provide a variable capacitance device with no directionality and an antenna apparatus using the variable capacitance device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a variable capacitance device, including: a first terminal and a second terminal for receiving signals to be processed; a plural, even number of variable capacitance elements connected in series between the first terminal and the second terminal, each of the variable capacitance elements being configured to change a capacitance thereof in accordance with a voltage across the variable capacitance element; a third terminal and a fourth terminal for receiving a same voltage; a fifth terminal and a sixth terminal for grounding, a voltage differential between the first and fourth terminals and the fifth and sixth terminals being a bias voltage for adjusting a total capacitance between the first terminal and the second terminal; a plurality of first resistors, each of the first resistors being connected to either the third terminal or the fourth terminal on one end thereof; and a plurality of second resistors, each of the second resistors being connected to either the fifth terminal or the sixth terminal on one end thereof, wherein, with respect to a series of successive nodes that begins with the first terminal, followed by a plurality of nodes that connect two adjacent variable capacitance elements in a serial chain of the plural, even number of variable capacitance elements, and that ends with the second terminal, respective other ends of a pair of the first resistors, one of which is connected to the third terminal and another of which is connected to the fourth terminal, are connected to every other node in the series of successive nodes, and respective other ends of a pair of the second resistors, one of which is connected to the fifth terminal and another of which is connected to the sixth terminal, are connected to the remaining every other node in the series of successive nodes so that the pair of the first resistors and the pair of the second resistors are alternately connected to the series of successive nodes.

In this manner, the voltage-applying terminals and the grounding terminals are each provided in pairs. Due to this, two sets of terminal groups are prepared whereby one set includes one voltage-applying terminal and one grounding terminal. Thus, when the two sets are arranged to have symmetry, a variable capacitance device that does not rely on the direction of insertion becomes possible.

It is more preferable for the first to sixth external electrodes on an external surface of the device to be respectively connected to the first to the sixth terminals, the first to the sixth external electrodes being arranged in a positional relationship so as to be 180° rotationally symmetrical about a center of the external surface.

Note that it is also possible to form an antenna apparatus that includes such a variable capacitance device.

An embodiment for the configuration stated above is described in detail below, but the present invention is not limited to this embodiment.

Even when the direction of insertion is changed by 180° during insertion of the variable capacitance device according to one aspect of the present invention, the same capacitance variability can be obtained. In other words, it is possible to obtain a variable capacitance device that does not rely on the direction of insertion.

It is to be understood that both the foregoing general description and the following detailed description are exemplary and explanatory, and are intended to provide further explanation of the invention as claimed.

BRIEF DESCRIPTION OF THE DRAWINGS

FIGS. 1A and 1B are views for describing a conventional variable capacitance device.

DETAILED DESCRIPTION OF EMBODIMENTS

Figure 3:
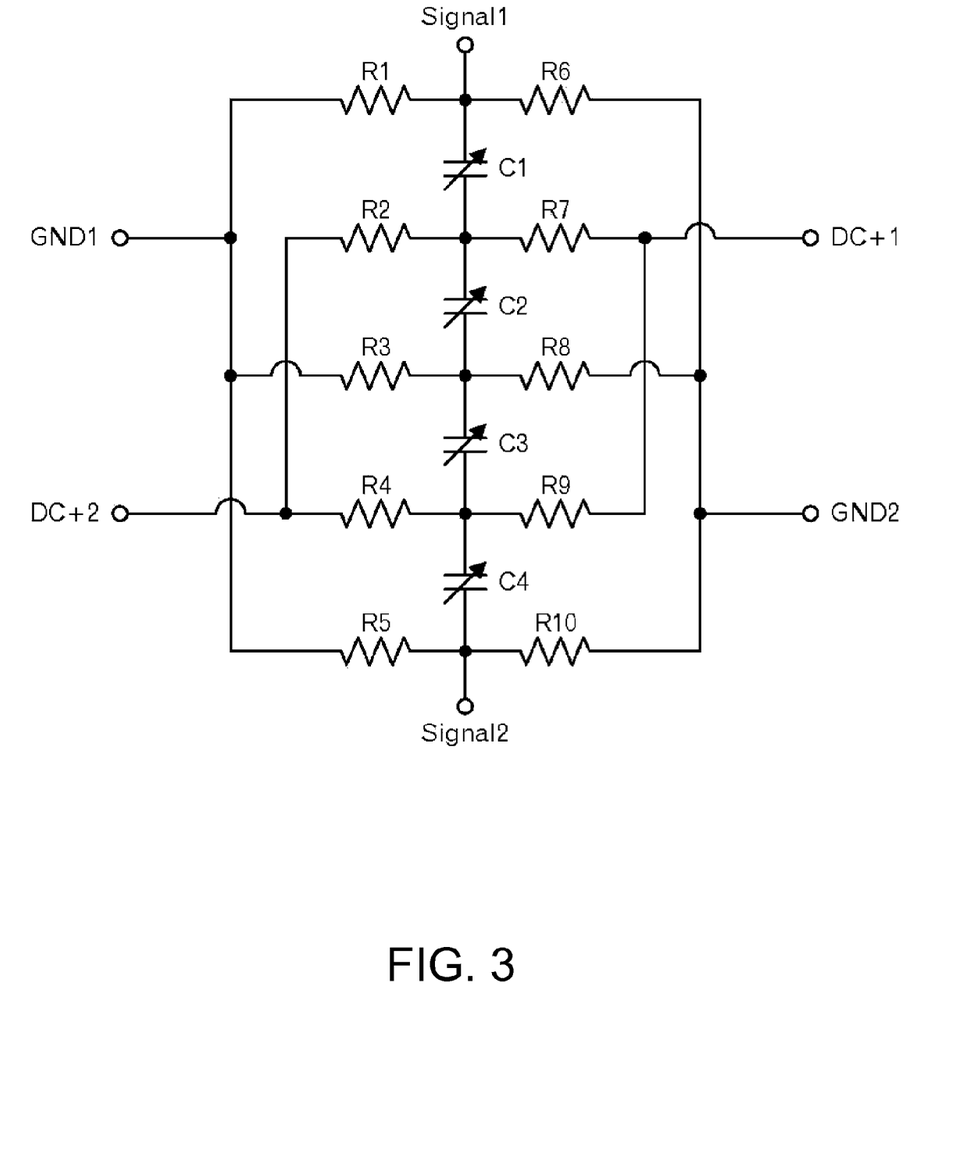
FIG. 3 shows an example configuration of a circuit for a variable capacitance device according to an embodiment of the present invention.

FIG. 3 shows an example circuit of a variable capacitance device according to an embodiment of the present invention. Even for the present embodiment, variable capacitance elements C1-C4 are connected in series between signal terminals Signal 1 and Signal 2. The variable capacitance device according to the present embodiment also has resistors R1-R10. The resistors R1-R10 have the same resistance value, for example.

One end of each of the resistors R1, R3, R5 is connected to a first ground terminal GND1. The other end of the resistor R1 is connected to a terminal of the variable capacitance element C1 near the signal terminal Signal 1. The other end of the resistor R3 is connected to a node of the variable capacitance elements C2, C3. The other end of the resistor R5 is connected to a terminal of the variable capacitance element C4 near the signal terminal Signal 2.

In addition, one end of each of the resistors R2, R4 is connected to a second bias terminal DC+2. The other end of the resistor R2 is connected to a node of the variable capacitance elements C1, C2. The other end of the resistor R4 is connected to a node of the variable capacitance elements C3, C4.

Similarly, one end of each of the resistors R6, R8, R10 is connected to a second ground terminal GND2. The other end of the resistor R6 is connected to the terminal of the variable capacitance element C1 near the signal terminal Signal 1. The other end of the resistor R8 is connected to the node of the variable capacitance elements C2, C3. The other end of the resistor R10 is connected to the terminal of the variable capacitance element C4 near the signal terminal Signal 2.

In addition, one end of each of the resistors R7, R9 is connected to a first bias terminal DC+1. The other end of the resistor R7 is connected to the node of the variable capacitance elements C1, C2. The other end of the resistor R9 is connected to the node of the variable capacitance elements C3, C4.

In this manner, the connections are bilaterally symmetrical along the line that includes the variable capacitance elements C1-C4. That is, for any of the variable capacitance elements, one end thereof is connected to the ground terminals via two paths with a resistor interposed therebetween on each path, and the other end is connected to the bias terminals via two paths with a resistor interposed therebetween on each path.

Figure 4:
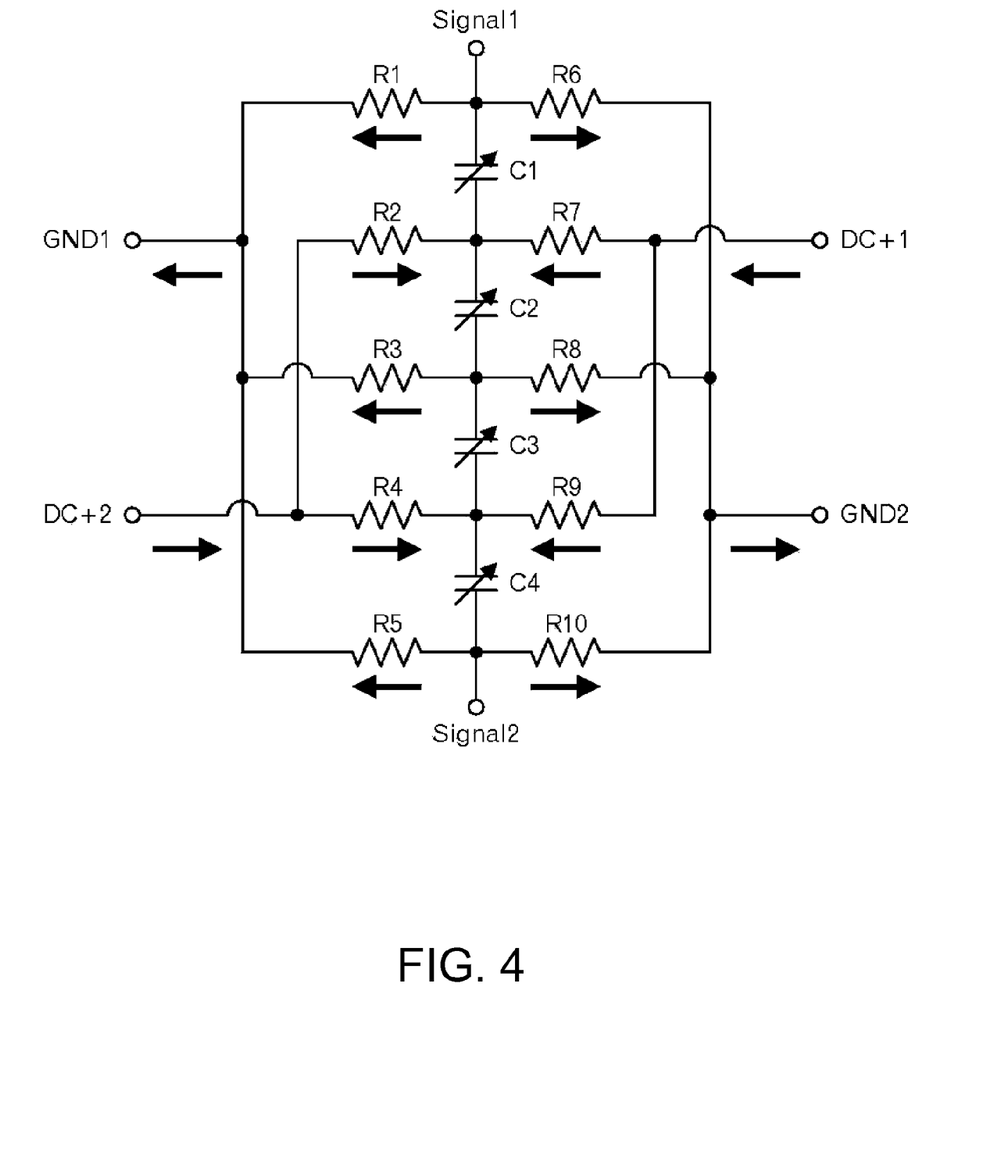
FIG. 4 schematically shows the flow of current when a bias voltage is applied.

By adopting such a circuit configuration, the current flows in accordance with the bias voltage shown by the arrows in FIG. 4. That is, the current flows from the first and the second bias terminals DC+1, DC+2 through the resistors R2, R4, R7, R9 to the variable capacitance elements C1-C4.

Furthermore, the current flows towards the other end of each of the variable capacitance elements C1-C4. Thus, for the variable capacitance element C1, the current flows through the resistors R1, R6 to the first and second ground terminals GND1, GND2. For the variable capacitance element C2, the current flows through the resistors R3, R8 to the first and second ground terminals GND1, GND2. For the variable capacitance element C3, the current flows through the resistors R3, R8 to the first and second ground terminals GND1, GND2. For the variable capacitance element C4, the current flows through the resistors R5, R10 to the first and second ground terminals GND1, GND2.

Figure 5:
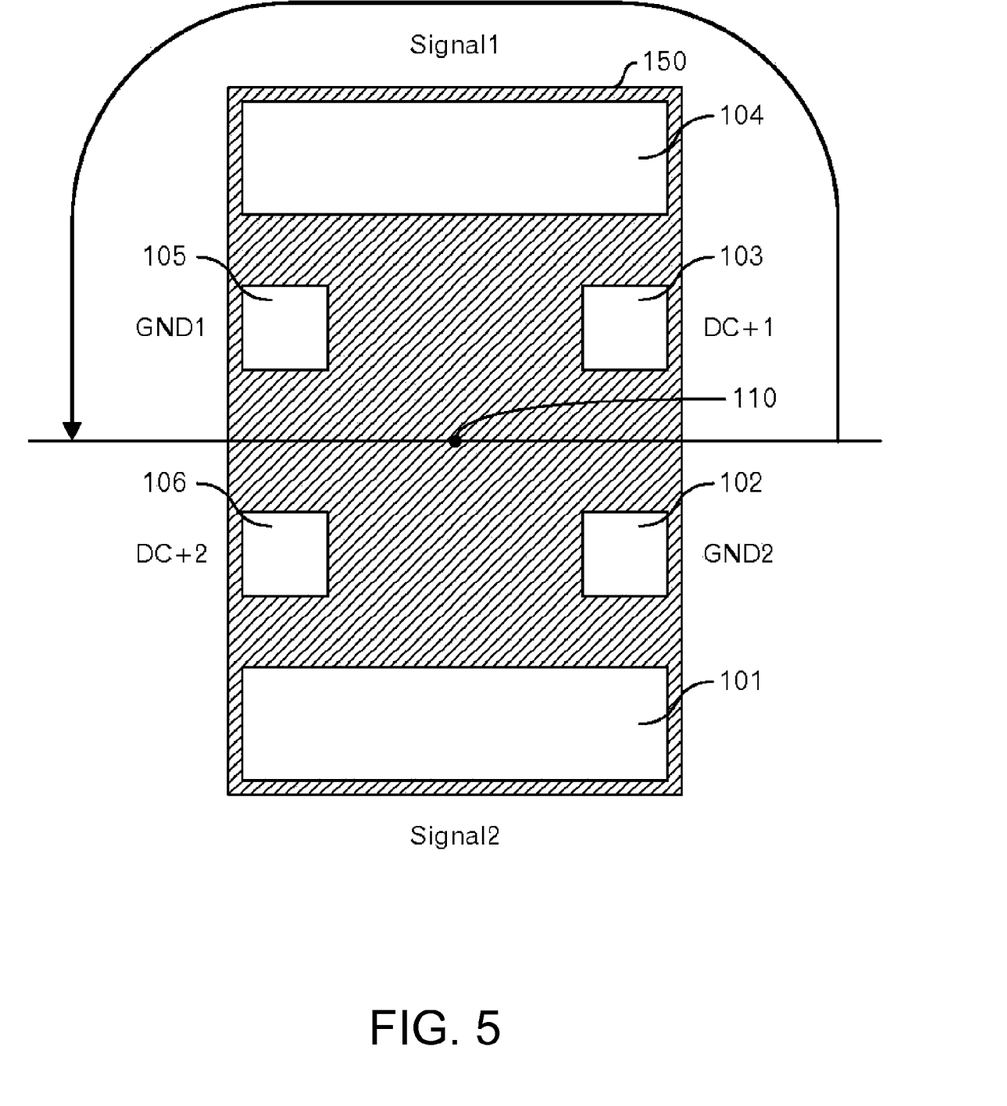
FIG. 5 is a bottom view showing an example of how the variable capacitance device can be inserted.

When such a circuit configuration is adopted, made into a thin film rectangular cuboid-shaped variable capacitance device, for example, and inserted, it becomes possible to adopt an external electrode arrangement shown in FIG. 5. That is, an external electrode 104 connected to the signal terminal Signal 1, an external electrode 101 connected to the signal terminal Signal 2, an external electrode 103 connected to the first bias terminal DC+1, an external electrode 102 connected to the second ground terminal GND2, an external electrode 105 connected to the first ground terminal GND1, and an external electrode 106 connected to the second bias terminal DC+2 are formed on one external surface 150 (a bottom surface, for example) of the variable capacitance device.

In this manner, the positional relationship of the external electrodes does not change even when the variable capacitance device is rotated 180° with a center point 110 of the external surface 150 as the center. That is, the external electrodes 101-106 are arranged so as to become 180° rotationally symmetrical. In other words, when the variable capacitance device is rotated 180°, the external electrode 103 moves to the location of the external electrode 106, and the external electrode 106 moves to the location of the external electrode 103, but this rotation does not create a problem, because both of the external electrodes 103, 106 are bias terminals. Similarly, the external electrode 102 moves to the location of the external electrode 105, and the external electrode 105 moves to the location of the external electrode 102, but this rotation does not create a problem, because both of the external electrodes 102, 105 are ground terminals.

That is, it is possible to have an external electrode arrangement in which the direction of insertion for the variable capacitance device cannot be mistaken during insertion.

Figure 6:
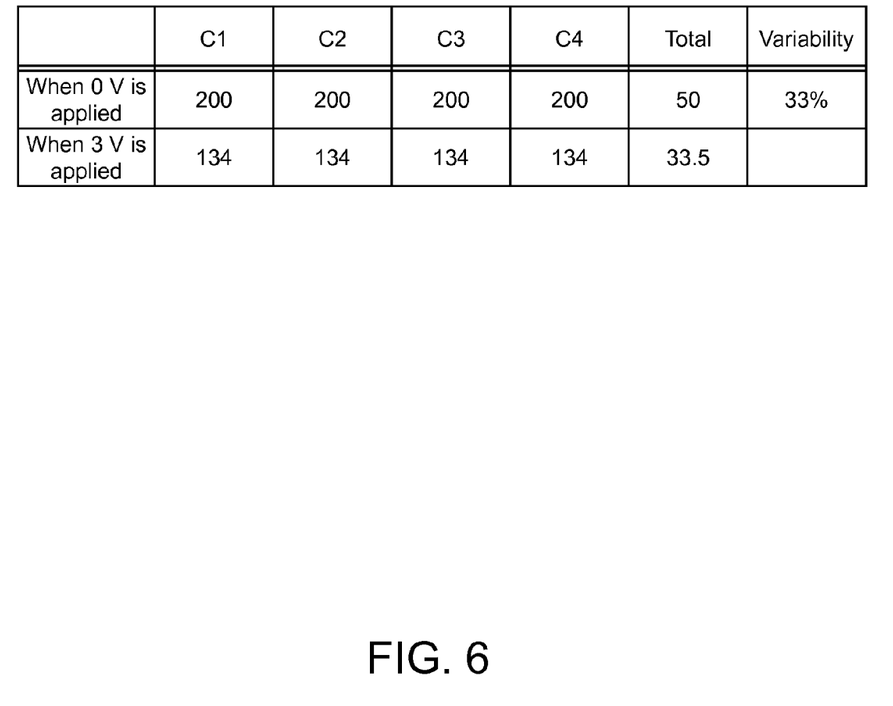
FIG. 6 is a table for describing the rate of change of the capacitance according to the present embodiment.

In addition, by adopting such a circuit configuration, as shown in FIG. 6, when DC+=+3 V, the capacitance of each of the variable capacitance elements C1-C4 changes by 33%, thereby changing the capacitance by 33% even as a whole. When the conventional configuration is connected using a forward connection, the variability is also 33%, thus making it possible to adjust the capacitance of the variable capacitance device according to the present embodiment in a similar manner as that of the conventional configuration.

Figure 7:
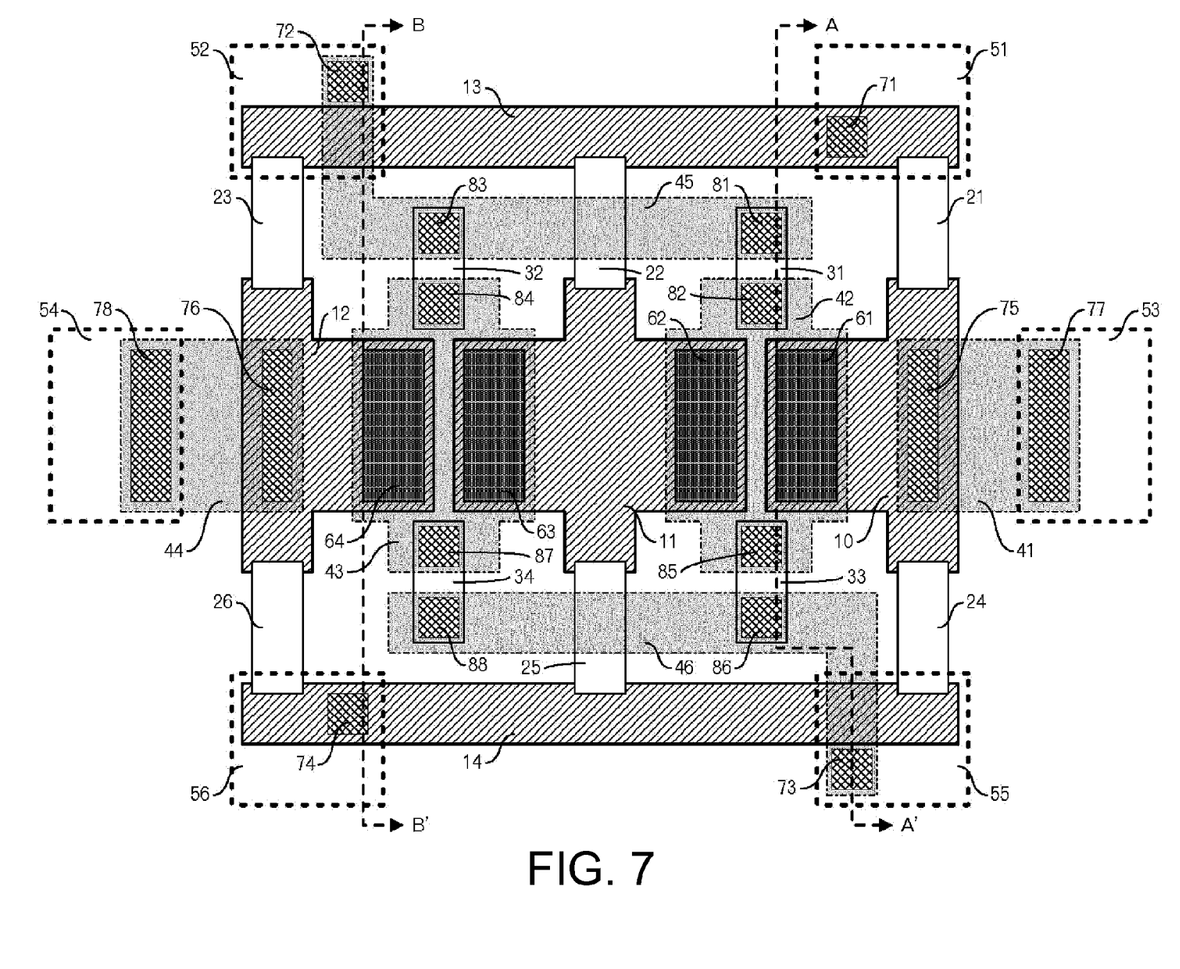
FIG. 7 is a see-through front view showing the example of how the variable capacitance device can be inserted.

Next, FIG. 7 shows a see-through front view of the example of how the circuit configuration shown in FIG. 3 can be inserted. Formed on a portion of the lowest layer of the variable capacitance device of the present embodiment are a lower conductor 10 for the variable capacitance element C1, a lower conductor 11 for the variable capacitance elements C2, C3, a lower conductor 12 for the variable capacitance element C4, a lower conductor 13 for a grounding wire, a lower conductor 14 for a grounding wire, a resistor film 21 corresponding to the resistor R1, a resistor film 22 corresponding to the resistor R3, a resistor film 23 corresponding to the resistor R5, a resistor film 24 corresponding to the resistor R6, a resistor film 25 corresponding to the resistor R8, and a resistor film 26 corresponding to the resistor R10.

The resistor film 21 is formed so as to connect to the lower conductor 13 and to the lower conductor 10. The resistor film 22 is formed so as to connect to the lower conductor 13 and to the lower conductor 11. The resistor film 23 is formed so as to connect to the lower conductor 13 and to the lower conductor 12. Similarly, the resistor film 24 is formed so as to connect to the lower conductor 14 and to the lower conductor 10. The resistor film 25 is formed so as to connect to the lower conductor 14 and to the lower conductor 11. The resistor film 26 is formed so as to connect to the lower conductor 14 and to the lower conductor 12.

A dielectric layer and an upper electrode layer 61, which will be described later, are formed above the lower conductor 10. A dielectric layer, an upper electrode layer 62, another dielectric layer, and an upper electrode layer 63, which will be described later, are formed above the lower conductor 11. A dielectric layer and an upper electrode layer 64, which will be described later, are formed above the lower conductor 12.

An upper conductor 42 is formed above the dielectric layer and the upper electrode layer 61, which are formed above the lower conductor 10, and above the dielectric layer and the upper electrode layer 62, which are formed above the lower conductor 11. An upper conductor 43 is formed above the dielectric layer and the upper electrode layer 63, which are formed above the lower conductor 11, and above the dielectric layer and the upper electrode layer 64, which are formed above the lower conductor 12. Thus, a connection is formed in which the variable capacitance elements C1-C4 are connected in series.

In addition, an upper conductor 45 and an upper conductor 46 are formed. The upper conductor 45 is for connecting the upper conductors 42, 43 to a pad 52 corresponding to the second bias terminal DC+2, and the upper conductor 46 is for connecting the upper conductors 42, 43 to a pad 55 corresponding to the first bias terminal DC+1. The upper conductor 42 and the upper conductor 45 are connected through a via 82 filled with a conductor, a resistor film 31, and a via 81 filled with a conductor. The upper conductor 43 and the upper conductor 45 are connected through a via 84 filled with a conductor, a resistor film 32, and a via 83 filled with a conductor. Similarly, the upper conductor 42 and the upper conductor 46 are connected through a via 85 filled with a conductor, a resistor film 33, and a via 86 filled with a conductor. The upper conductor 43 and the upper conductor 46 are connected through a via 87 filled with a conductor, a resistor film 34, and a via 88 filled with a conductor. The pads 52, 55 are formed on the uppermost layer. The upper conductor 45 and the pad 52 are connected through a via 72 filled with a conductor. Furthermore, the upper conductor 46 and the pad 55 are connected through a via 73 filled with a conductor.

Note that the lower conductor 10 and a pad 53 corresponding to the first signal terminal are connected through a via 75 filled with a conductor, an upper conductor 41, and a via 77 filled with a conductor. Similarly, the lower conductor 12 and a pad 54 corresponding to the second signal terminal are connected through a via 76 filled with a conductor, an upper conductor 44, and a via 78 filled with a conductor. The pads 53, 54 are formed on the uppermost layer.

In addition, the lower conductor 13 and a pad 51 corresponding to the first ground terminal GND1 are connected through a via 71 filled with a conductor. Furthermore, the lower conductor 14 and a pad 56 corresponding to the second ground terminal GND2 are connected through a via 74 filled with a conductor. The pads 51, 56 are formed on the uppermost layer.

Figure 8:
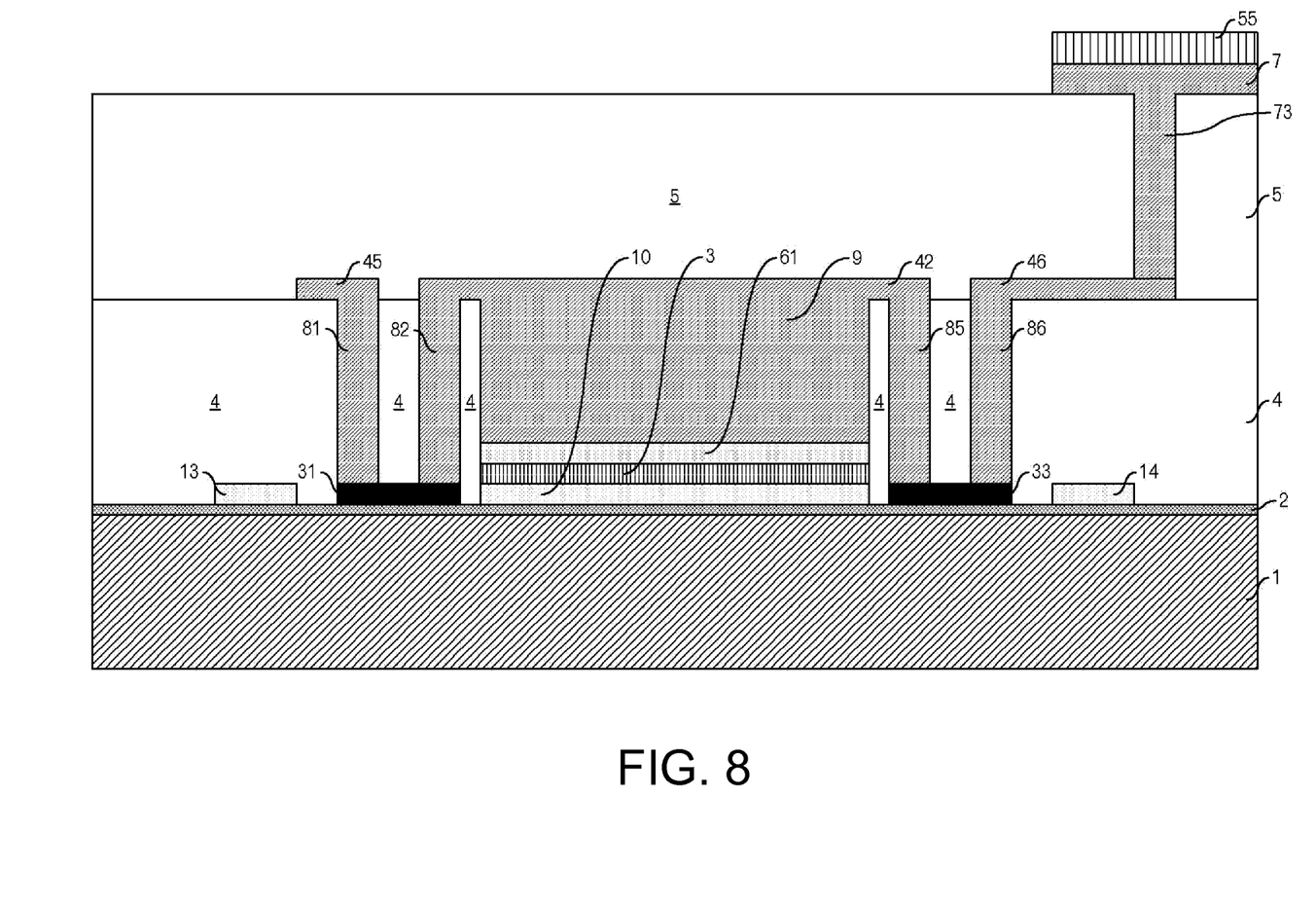
FIG. 8 is a cross-sectional view along the cross section AA' of the variable capacitance device.

FIG. 8 shows a cross-sectional view along the cross section AA' of FIG. 7 for this type of configuration.

A support substrate 1 is a Si substrate having a thickness of 200 μm, for example. A thermal oxide film (SiO$_2$) having a thickness of 1 μm, for example, is formed on the top surface of the support substrate 1. However, the support substrate 1 may be an object having an insulating layer formed on an insulating substrate of quartz, alumina, sapphire, glass, or the like or on an electro-conductive substrate (preferably a highly resistant substrate) of Si or the like.

An insulating layer 2 having a thickness of 100 nm, for example, is formed on the entire top surface of the support substrate 1. The insulating layer 2 is Al$_2$O$_3$, for example, but may be a single layer of SiN, Ta$_2$O$_5$, SrTiO$_3$, or the like or a combination thereof.

The lower conductor 13, the lower conductor 14, and the lower conductor 10 having a thickness of 250 nm, for example, are formed on the insulating layer 2. The lower conductor 13, the lower conductor 14, and the lower conductor 10 are composed of Pt, for example. Ti or TiO$_2$ may be formed as an adhesive layer under the Pt. Pt may be substituted with a noble metal such as Ir or Ru, an electro-conductive oxide such as SrRuO$_3$, RuO$_2$, IrO$_2$, or the like.

In addition, the resistor films 31, 33 having a thickness of 80 nm, for example, are also formed on the insulating layer 2. The resistor films 31, 33 are composed of TaSiN, for example. However, the resistor films 31, 33 may be high-resistance films of a NiCr alloy, FeCrAl alloy, or the like.

A dielectric layer 3 having a thickness of 100 nm, for example, is formed on the lower conductor 10. The dielectric layer 3 is composed of BaSrTiO3 (BST) that has had trace amounts of Mn added thereto, for example. BST may be substituted with another perovskite structure oxide such as PbZrTiO3 (PZT), or the like.

Furthermore, the upper electrode layer 61 having a thickness of 250 nm, for example, is formed on the dielectric layer 3. The upper electrode layer 61 is also formed using Pt, but similar to the lower conductor 10, the upper electrode layer 61 may also be a noble metal such as Ir or Ru, an electro-conductive oxide such as SrRuO$_3$, RuO$_2$, IrO$_2$, or the like.

One variable capacitance element is formed using the lower conductor 10, the dielectric layer 3, and the upper electrode layer 61.

After the upper electrode layer 61 or the like, for example, are formed, an insulating layer 4 having a thickness of 3 μm, for example, is also formed as a protective layer. The insulating layer 4 is a polyimide resin, for example, but may also be a variety of inorganic insulating films such as SiO$_2$, for example, a variety of organic insulating films such as a benzocyclobutene (BCB) resin, or the like.

After the insulating layer 4 is formed, a node 9 with the upper electrode layer 61, the vias 81, 82, the vias 85, 86, and the like are formed, and then the upper conductor 42, the upper conductor 45, and the upper conductor 46 are formed using plasma etching or a similar etching method, for example. The upper conductor 42, the upper conductor 45, and the upper conductor 46 are formed using a variety of electro-conductive materials such as Cu or Al, for example.

Note that there are also cases in which a sheet layer/electro-conductive moisture resistant layer is formed before the upper conductor 42 or the like is formed, although these cases are not shown in the figures. The sheet layer/electro-conductive moisture resistant layer is composed of TaN (40 nm)/Ta (30 nm)/Cu (100 nm), for example. TaN/Ta may be substituted with another nitride such as TiN, TiSiN, or TaSiN, another oxide such as SrRuO$_3$, IrO$_2$, or the like.

Furthermore, an insulating layer 5 having a thickness of 3 μm, for example, is formed as a protective layer over the upper conductor 42 and the like. The insulating layer 5 is formed using the same materials as that of the insulating layer 4.

Furthermore, after the insulating layer 5 is formed, the via 73 and the like are formed, and a conductive layer 7 is formed, for example. The conductive layer 7 is formed using the same materials as that of the upper conductor 42 and the like. Note that there are also cases in which a sheet layer/electro-conductive moisture resistant layer as described above is formed before the conductive layer 7 is formed.

The pad 55 is formed on the conductive layer 7. The pad 55 has a thickness of 5 μm, for example, and SnAg, an AlCu alloy, Au, a soldered material, or the like may be used.

Figure 9:
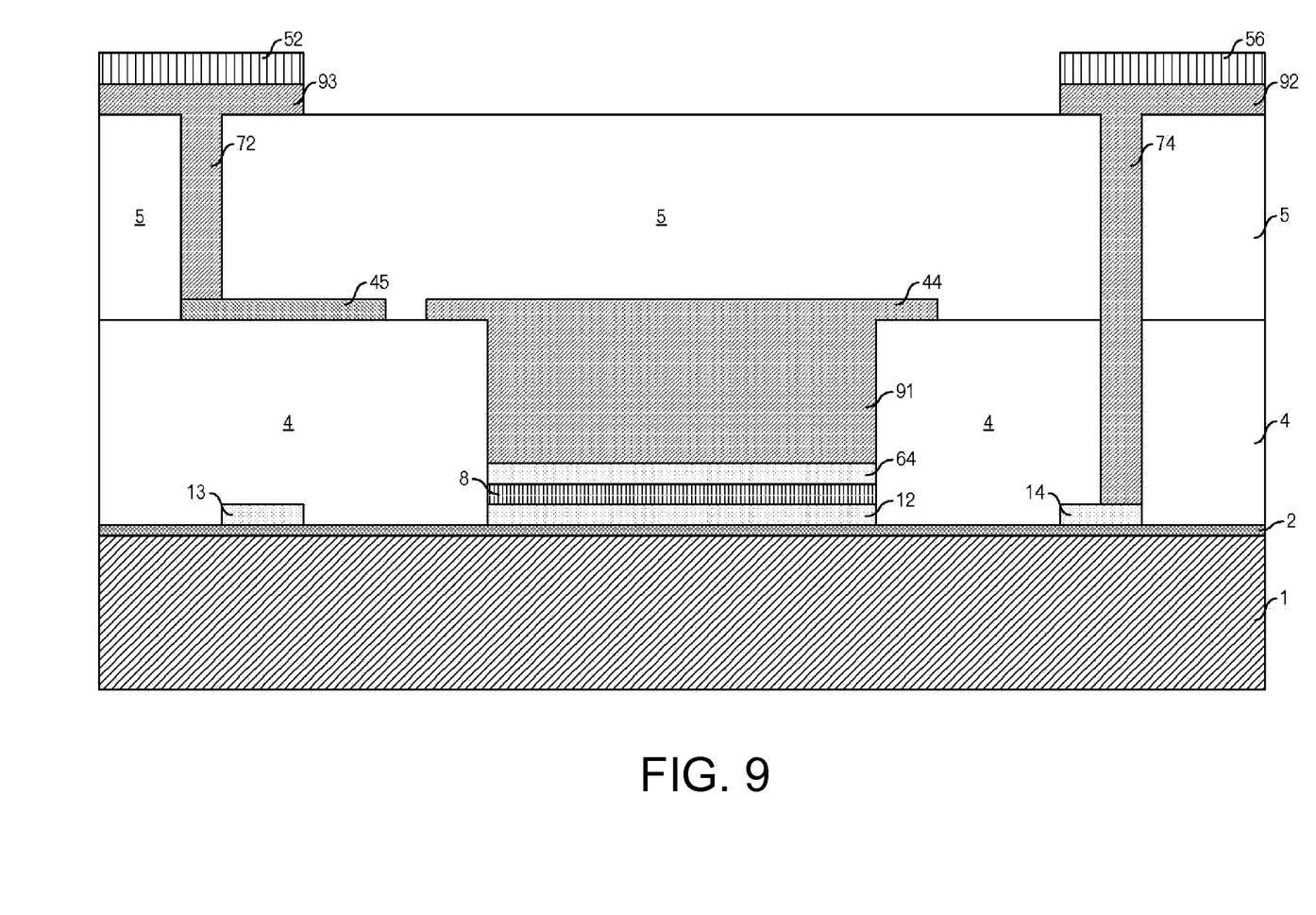
FIG. 9 is a cross-sectional view along the cross section BB' of the variable capacitance device.

FIG. 9 shows a cross-sectional view along the cross section BB' of FIG. 7.

As described in FIG. 8, the insulating layer 2 is formed on the entire top surface of the support substrate 1. The lower conductors 12-14 are formed on the insulating layer 2. A dielectric layer 8 is formed on the lower conductor 12. The upper electrode layer 64 is formed on the dielectric layer 8. One variable capacitance element is formed using the lower conductor 12, the dielectric layer 8, and the upper electrode layer 64.

After the upper electrode layer 64 is formed, the insulating layer 4 is formed. Then a node 91 of the upper electrode layer 64 is formed, and the upper conductors 44, 45 are formed, using plasma etching or a similar etching method, for example. Furthermore, the insulating layer 5 is formed over the upper conductors 44, 45 and the like.

After the insulating layer 5 is formed, the vias 72, 74 are formed, and conductive layers 93, 92 are formed, for example. The pad 52 corresponding to the second bias terminal DC+2 is formed on the conductive layer 93. In addition, the pad 56 corresponding to the second ground terminal GND2 is formed on the conductive layer 92.

Such a configuration of layers is one example configuration, and as long as the circuit configuration described above is implemented, any configuration of layers may be used.

In the example described above, a circuit configuration in which four variable capacitance elements are connected in series is shown, but this number of variable capacitance elements is but one example. As long as the circuit configuration is a configuration in which an even number of variable capacitance elements are connected in series, it is possible to configure a circuit to have the same effects.

Figure 10:
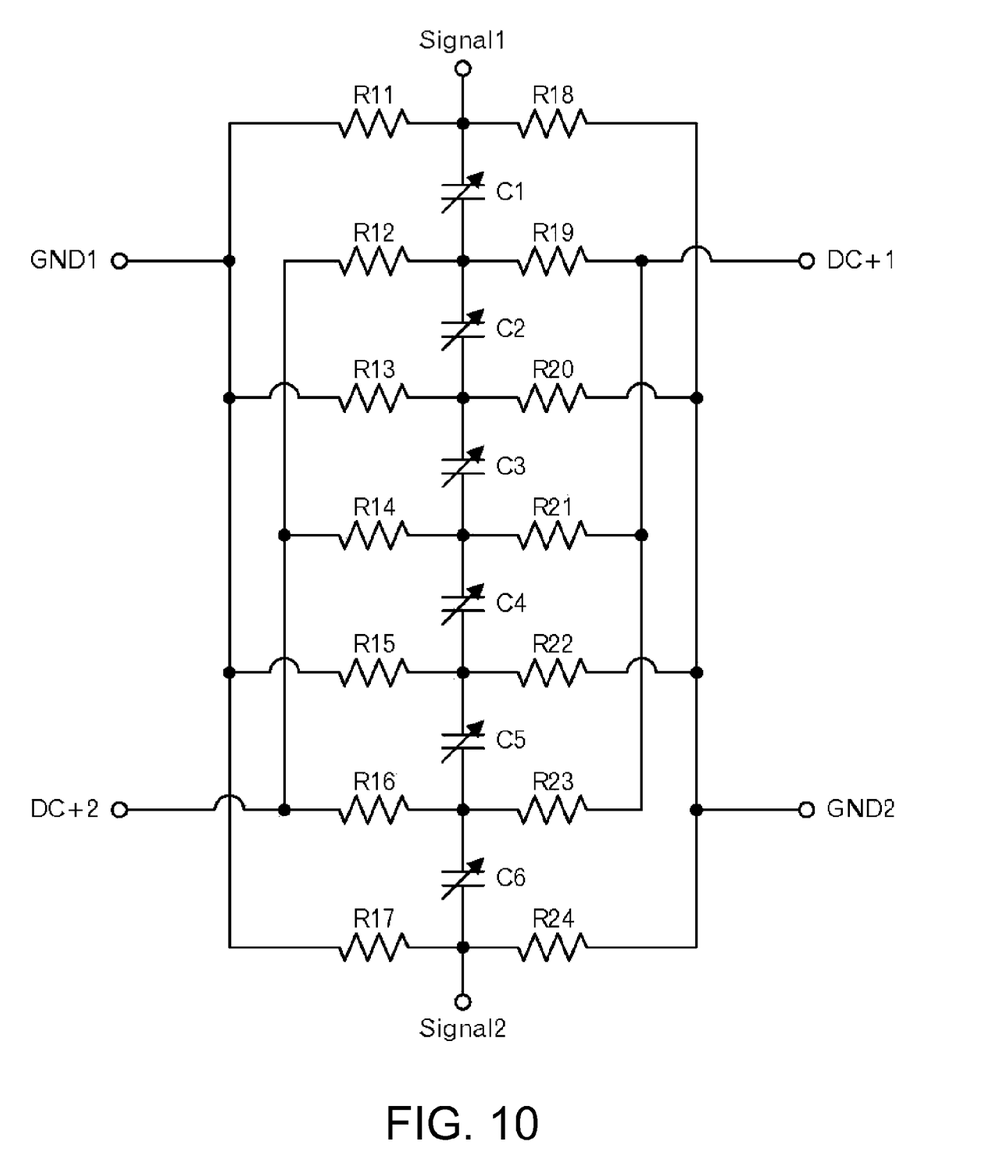
FIG. 10 shows a first modification example of the present embodiment.

As shown in FIG. 10, six variable capacitance elements C1-C6 may be connected in series, for example. In this circuit configuration, 14 resistors R11-R24 are used, which is four more than the number of resistors in FIG. 3. However, the resistors R11, R18, R17, R24, which are connected to the signal terminals Signal 1, Signal 2, are connected to the second ground terminal GND2, but the configuration shown in FIG. 10 is similar to that of the circuit shown in FIG. 3, the configuration being one in which one end of each of the variable capacitance elements is connected to the ground terminals via two paths with a resistor interposed therebetween on each path, and the other end is connected to the bias terminals via two paths with a resistor interposed therebetween on each path.

Figure 11:
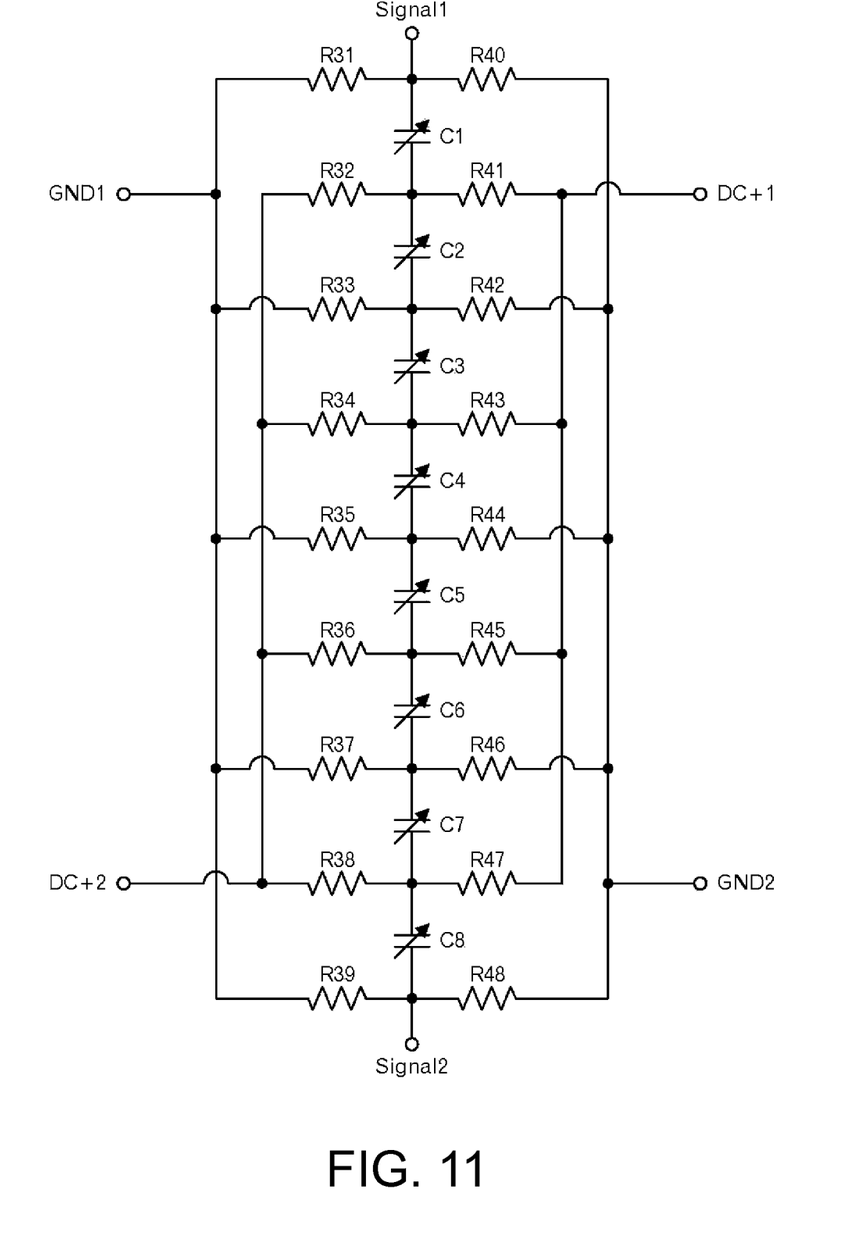
FIG. 11 shows a second modification example of the present embodiment.

As shown in FIG. 11, eight variable capacitance elements C1-C8 may also be connected in series. In this circuit configuration, 18 resistors R31-R48 are used, which is eight more than the number of resistors in FIG. 3. However, the resistors R31, R40, R39, R48, which are connected to the signal terminals Signal 1, Signal 2, are connected to the second ground terminal GND2, but the configuration shown in FIG. 11 is the similar to that of the circuit shown in FIG. 3, the configuration being one in which one end of each of the variable capacitance elements is connected to the ground terminals via two paths with a resistor interposed therebetween on each path, and the other end is connected to the bias terminals via two paths with a resistor interposed therebetween on each path.

Figure 12:
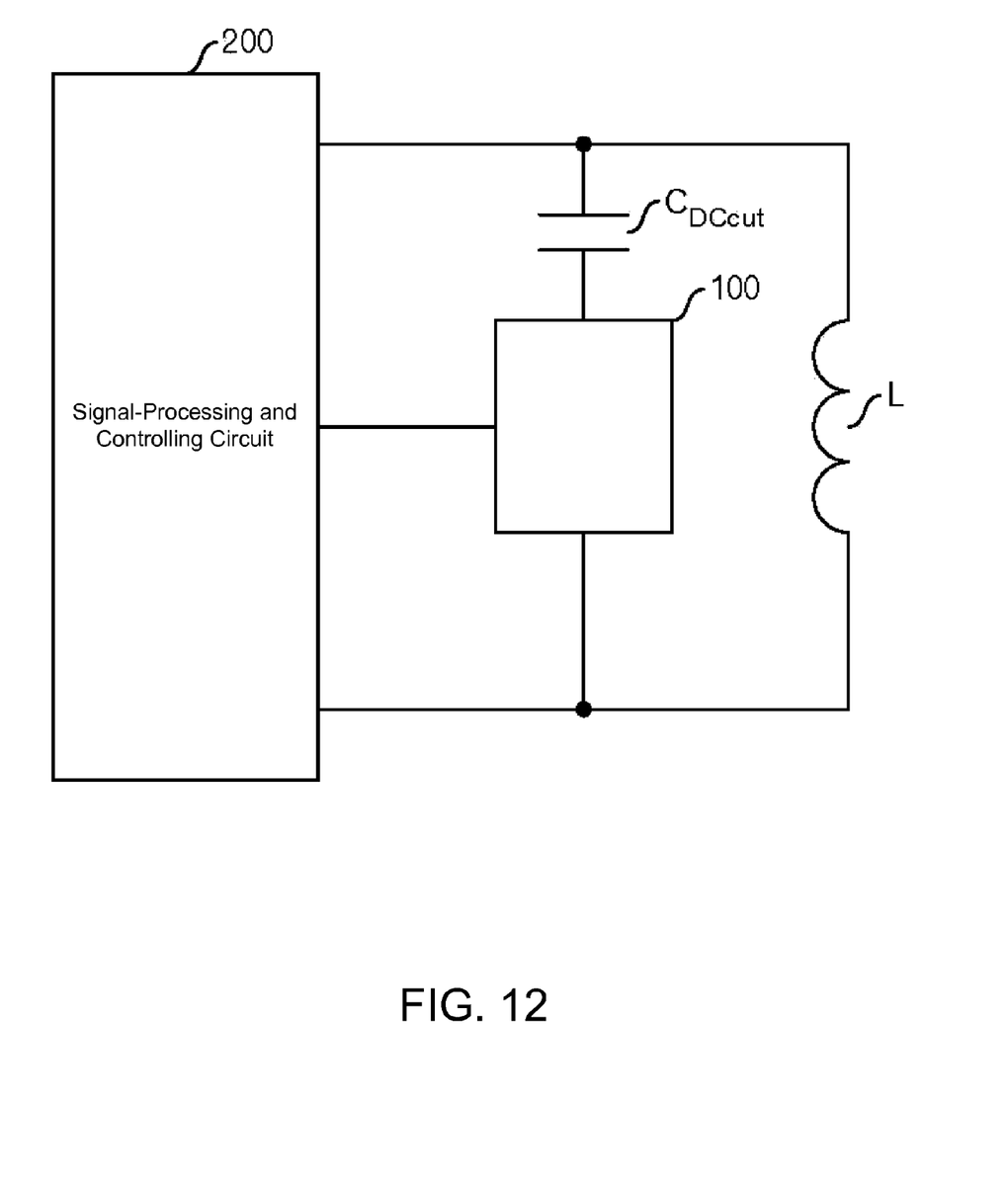
FIG. 12 shows one example of an antenna circuit using the variable capacitance device according to the present embodiment.

Note that an antenna apparatus using the variable capacitance device according to the present embodiment has a configuration as shown in FIG. 12, for example. The antenna apparatus has a signal-processing and controlling circuit 200, a capacitor $C_{DCut}$ for cutting the DC, a variable capacitance device 100, and a coil L that is used as an antenna. In order to be able to appropriately demodulate signals received by the coil L, the signal-processing and controlling circuit 200 applies an appropriate voltage to the variable capacitance device 100.

As long as the variable capacitance device according to the present embodiment is adopted, it is possible to insert the variable capacitance device 100 into the antenna apparatus without paying attention to whether the variable capacitance device 100 is facing the left or the right when such an antenna apparatus is being manufactured.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A variable capacitance device, comprising:
   a first pad and a second pad for receiving signals to be processed;
   a plural, even number of variable capacitance elements connected in series and disposed along a straight line formed between the first pad and the second pad, each of the variable capacitance elements being configured to change a capacitance thereof in accordance with a voltage across the variable capacitance element;
   a third pad and a fourth pad for receiving a same voltage, the third pad being disposed on a left-hand side of said straight line and the fourth pad being on a right-hand side of said straight line;
   a fifth pad and a sixth pad for grounding, the fifth pad being disposed on the left-hand side of said straight line and the sixth pad being on the right-hand side of said straight line, a voltage differential between the third and fourth pads and the fifth and sixth pads being a bias voltage for adjusting a total capacitance between said first pad and said second pad,
   wherein for each of said plural, even number of variable capacitance elements, one end of the variable capacitance element is connected to the third and fourth pads through two separate paths, respectively, with a first resistor interposed in series on each path, and another end of the variable capacitance element is connected to the fifth and sixth pads through two separate paths, respectively, with a second resistor interposed in series on each path so that in said straight line between the first pad and the second pad, nodes connected to the third and fourth pads through the respective first resistors and nodes connected to the fifth and sixth pads through the respective second resistors alternate.

2. The variable capacitance device according to claim 1, wherein said first to the sixth pads are arranged on an external surface of the device such that a pair of the first and second pads, a pair of the third and fourth pads, and a pair of the fifth and sixth pads are each 180° rotationally symmetrical about a center of said external surface.

3. An antenna apparatus, comprising:
   an antenna; and
   the variable capacitance device according to claim 2, connected to the antenna.

4. An antenna apparatus, comprising:
   an antenna; and
   the variable capacitance device according to claim 1, connected to the antenna.

5. The variable capacitance device according to claim 1, wherein every even-numbered node as counted from the first pad is connected to the third and fourth pads through said first resistors, respectively, and every odd-numbered node as counted from the first pad is connected to the fifth and sixth pads through said second resistors, respectively.

* * * * *